United States Patent [19]
Morishita et al.

[11] Patent Number: 5,694,364
[45] Date of Patent: Dec. 2, 1997

[54] SEMICONDUCTOR INTEGRATED CIRCUIT DEVICE HAVING A TEST MODE FOR RELIABILITY EVALUATION

[75] Inventors: Fukashi Morishita; Masaki Tsukude; Kazutami Arimoto, all of Hyogo, Japan

[73] Assignee: Mitsubishi Denki Kabushiki Kaisha, Tokyo, Japan

[21] Appl. No.: 779,186

[22] Filed: Jan. 6, 1997

[30] Foreign Application Priority Data

Jul. 3, 1996 [JP] Japan .................................. 8-173838

[51] Int. Cl.$^6$ ........................................................ G11C 7/00
[52] U.S. Cl. ................................................. 365/201; 365/226
[58] Field of Search .................................. 365/201, 226, 365/227, 228

[56] References Cited

FOREIGN PATENT DOCUMENTS 59-225559  12/1984  Japan.
4-311898   11/1992  Japan.

OTHER PUBLICATIONS

ULSI-DRAM Technology, pp. 196–197, Science Forum, Sep. 25, 1992 "Ultra LSI Memory", by S. Itoh, Baifukan pp. 299–230, Nov. 5, 1994.

Primary Examiner—David C. Nelms
Assistant Examiner—F. Nirandjan
Attorney, Agent, or Firm—Lowe, Price, LeBlanc & Becker

[57] ABSTRACT

In the normal mode, a first voltage-down converter down-converts an external power supply voltage to provide a large, first internal power supply voltage to the peripheral circuitry via a first internal power supply voltage supplying line, and a second voltage-down converter down-converts the external power supply voltage to provide a smaller, second internal power supply voltage to a memory cell array via a second internal power supply voltage supplying line. This allows fast operation and reduction in power consumption. In conducting a burn-in test, an external power supply voltage supplying line is connected to the first and second internal power supply voltage supplying lines. Thus, the first and second internal power supply voltage supplying lines directly receive the external power supply voltage. This allows an effective burn-in test. In a burn-in test, the first and second voltage-down converters are inactivated.

15 Claims, 9 Drawing Sheets

SEMICONDUCTOR INTEGRATED CIRCUIT DEVICE HAVING A TEST MODE FOR RELIABILITY EVALUATION

BACKGROUND OF THE INVENTION

1. Field of the Invention

The present invention relates to a semiconductor integrated circuit device and more particularly relates to a semiconductor integrated circuit device with a circuit related to testing for evaluating reliability.

2. Description of the Background Art

In recent years, the power-supply voltage for a system itself including a memory is generally higher than a voltage required for operation of the memory, and an internal power supply voltage required for memory operation is often generated by down-converting a voltage within the memory chip to supply the power supply voltage for the memory from the power supply voltage from the system itself. A circuit which thus generates an internal power supply voltage is referred to as a voltage-down converter. Use of such a voltage-down converter considerably reduces power consumption of the memory chip and allows stable voltage supply to the interior of the memory chip.

FIG. 16 schematically shows a portion of a DRAM (dynamic random access memory) as a conventional semiconductor integrated circuit device.

Referring to FIG. 16, the conventional DRAM includes a power supply pad 41, a voltage-down converter (VDC) 245 and a PMOS transistor 47. Voltage-down converter 245 and PMOS transistor 47 are both provided between an external power supply voltage supplying line 51 and an internal power supply voltage supplying line 247. A signal /STR is input to the gate of PMOS transistor 47. An external power supply voltage extVcc is supplied on external power supply voltage supplying line 51 via power supply pad 41. Voltage-down converter 245 down-converts the external power supply voltage extVcc to generate an internal power supply voltage intVcc for supplying onto internal power supply voltage supplying line 247. Voltage-down converter 245 thus operates in the normal mode, which does not include the test mode for reliability evaluation, and stops the operation in the test mode for reliability evaluation. Testing for evaluating reliability will be described later in detail. PMOS transistor 47 is in an off state in the normal mode and disconnects external power supply voltage supplying line 51 from internal power supply voltage supplying line 247. That is, in the normal mode the signal /STR is at a high level. PMOS transistor 47 connects external power supply voltage supplying line 51 to internal power supply voltage supplying line 247 in the test mode for reliability evaluation. That is, in the test mode for reliability evaluation, the signal /STR is at a low level.

FIG. 17 is a circuit diagram showing in detail a differential amplifier portion of voltage-down converter (VDC) 245 shown in FIG. 16. Referring to FIG. 17, the differential amplifier portion of voltage-down converter (VDC) 245 shown in FIG. 18. Referring to FIG. 17, the differential amplifier portion of the conventional DRAM includes a DRAM-on-standby-state (DRAM SS) circuit and a DRAM-on-active-state (DRAM AS) circuit. The DRAM SS circuit operates when the DRAM is on the standby and active states. The DRAM AS circuit operates when the DRAM is on the active state. The DRAM SS circuit in the differential amplifier portion includes a differential amplifier 93, an NMOS transistor 97 and a PMOS transistor 105. A reference voltage Vref is supplied to one input node of differential amplifier 93. The other input node of differential amplifier 93 is connected to internal power supply voltage supplying line 247. NMOS transistor 97 has its drain and its source connected to differential amplifier 93 and a node of the ground voltage, respectively, and receives a constant intermediate voltage BiasL at its gate. PMOS transistor 105 is provided between a node of the external power supply voltage extVcc and internal power supply voltage supplying line 247. PMOS transistor 105 has its gate connected to an output node of differential amplifier 93. The DRAM AS circuit in the differential amplifier portion includes a differential amplifier 95, an NMOS transistor 101 and PMOS transistors 107 and 109. One input node of differential amplifier 95 receives the reference voltage Vref. The other input node of differential amplifier 95 is connected to internal power supply voltage supplying line 247. NMOS transistor 101 has its drain and its source connected to differential amplifier 95 and a node of the ground voltage, respectively, and receives a signal ACT at its gate. PMOS transistor 109 is connected between a node of the external power supply voltage extVcc and internal power supply voltage supplying line 247. PMOS transistor has its gate connected to an output node N1 of differential amplifier 95. PMOS transistor 107 is provided between a node of the external power supply voltage extVcc and output node N1 of differential amplifier 95. The gate of PMOS transistor 107 receives the signal ACT.

The DRAM SS circuit in the differential amplifier portion is a feed back type circuit which adjusts the level of the internal power supply voltage intVcc by comparing the internal power supply voltage intVcc with the reference voltage Vref in differential amplifier 93 and controlling PMOS transistor 105 which receives the output of differential amplifier 93. Similar to the DRAM SS circuit, the DRAM AS circuit in the differential amplifier portion is also a feed back type circuit which adjusts the level of the internal power supply voltage intVcc by comparing the internal power supply voltage intVcc with the reference voltage Vref in differential amplifier 95 and controlling PMOS transistor 109 which receives the output of differential amplifier 95. Although the DRAM SS circuit in the differential amplifier portion is required to always operate, a current flowing through differential amplifier 93 is limited by the constant, intermediate voltage BiasL to reduce power consumption. The DRAM AS circuit in the differential amplifier portion is activated for a period during which the chip consumes a large current. That is, the signal ACT is at a CMOS level (a high level) for a period during which the chip consumes a large current, and is at a low level otherwise. For a period during which the chip does not consume a large current, that is, for a period during which the signal ACT is at a low level, PMOS transistor 107 is in an on-state and node N1 is set to a high level. Accordingly, when the signal ACT is at a low level, PMOS transistor 109 is turned off and the DRAM AS circuit is inactivated.

The testing for evaluating reliability will now be described. The period during which device failure occurs is generally divided into three sub-periods with time: initial failure period, accidental failure period and wear-out failure period. Initial failure is a failure which occurs immediately after the device is brought into use, and defects at the time of manufacturing the device appear in the initial failure. The rate of this failure rapidly reduces with time. Thereafter, a low failure rate continues for a long period (accidental failure). In time, the device approaches to the end of its useful life and the failure rate rapidly increases (wear-out failure period). Devices are desirably used within accidental failure period and this domain is useful life period. Therefore, a long accidental failure period with low and constant accidental failure rate is required to enhance device reliability. Meanwhile, in order to remove initial failure beforehand, screening is required for removing defective devices by applying accelerated-operation aging to devices for a predetermined time period. In order to effectively perform this screening in a short time period, it is desirable that initial failure rate rapidly reduces with respect to time so as to enter accidental failure period as soon as possible. Currently, burn-in test (high temperature operation test) is generally conducted as one of the screening techniques. Burn-in test is a technique by which a dielectric film can be directly evaluated using an actual device, and in this test, a high-temperature and high-electric-field stress is applied, so that all defective factors including migration of aluminum interconnections may appear. It is particularly effective to enhance acceleration by operating the device during temperature acceleration.

A DRAM as the conventional semiconductor integrated circuit device as shown in FIG. 16 uses one type of voltage-down converter 245 and an internal power supply voltage intVcc of one level, which causes the following problem: generally, a memory cell array is a larger power consumption source than the peripheral circuitry. Therefore, an internal power supply voltage intVcc supplied to the memory cell array is reduced to lower power consumption. However, since the conventional DRAM is provided with only one type of voltage-down converter 245, the peripheral circuitry will also receive the same, small internal power supply voltage intVcc. This does not allow fast operation.

On the other hand, the internal power supply voltage intVcc may be increased and supplied to the peripheral circuitry to achieve fast operation. However, since the conventional DRAM is provided with only one type of voltage-down converter 245, such a large power supply voltage intVcc will be also supplied to the memory cell array. This undesirably prevents reduction in power consumption.

SUMMARY OF THE INVENTION

The present invention is made to solve the above problem. It contemplates a semiconductor integrated circuit device capable of effectively testing for evaluating reliability as well as allowing fast operation and reduction in power consumption.

A semiconductor integrated circuit device according to a first aspect of the present invention has a test mode for reliability evaluation and a normal mode. The semiconductor integrated circuit device includes a first internal power supply voltage generating circuit, a second internal power supply voltage generating circuit, a first connecting element, and a second connecting element. The first internal power supply voltage generating circuit generates a first internal power supply voltage to be supplied to a first internal power supply voltage supplying line according to an external power supply voltage supplied from an external power supply voltage supplying line. The second internal power supply voltage generating circuit generates a second internal power supply voltage to be supplied to a second internal power supply voltage supplying line according to the external power supply voltage. The first connecting element is provided between the external power supply voltage supplying line and the first internal power supply voltage supplying line. The second connecting element is provided between the external power supply voltage supplying line and the second internal power supply voltage supplying line. The first and second internal power supply voltage generating circuits are inactivated in the test mode and activated in the normal mode. The first connecting element connects the external power supply voltage supplying line to the first internal power supply voltage supplying line in the test mode and disconnects the external power supply voltage supplying line from the first internal power supply voltage supplying line in the normal mode. The second connecting element connects the external power supply voltage supplying line to the second internal power supply voltage supplying line in the test mode and disconnects the external power supply voltage supplying line from the second internal power supply voltage supplying line in the normal mode.

Since the semiconductor integrate circuit device according to the first aspect of the present invention is provided with the first and second internal power supply voltage generating circuits, an internal circuit which requires fast operation can be supplied with a large internal power supply voltage and an internal circuit which consumes large power can be supplied with a small internal power supply voltage. Furthermore, since the external power supply voltage supplying line is connected to the first and second internal power supply voltage supplying lines in the test mode for reliability evaluation, an external power supply voltage can be directly supplied to the internal circuits. Thus, the semiconductor integrated circuit device according to the first aspect of the present invention can achieve fast operation and reduction in power consumption as well as perform an effective test for evaluating reliability.

A semiconductor integrated circuit device according to a second aspect of the present invention has a test mode for reliability evaluation and a normal mode. The semiconductor integrated circuit device includes a first internal power supply voltage generating circuit, a second internal power supply voltage generating circuit, a first connecting element and a second connecting element. The first internal power supply voltage generating circuit generates a first internal power supply voltage to be supplied to a first internal power supply voltage supplying line according to a first external power supply voltage supplied from a first external power supply voltage supplying line. The second internal power supply voltage generating circuit generates a second internal power supply voltage to be supplied to a second internal power supply voltage supplying line according to the first external power supply voltage supplied from a second external power supply voltage supplying line. The first connecting element is provided between the first external power supply voltage supplying line and the first internal power supply voltage supplying line. The second connecting element is provided between the second external power supply voltage supplying line and the second internal power supply voltage supplying line. The first and second internal power supply voltage generating circuits are inactivated in the test mode and activated in the normal mode. The first connecting element connects the first external power supply voltage supplying line to the first internal power supply voltage supplying line in the test mode and disconnects the first external power supply voltage supplying line from the first internal power supply voltage supplying line in the normal mode. The second connecting element connects the second external supply voltage supplying line to the second internal power supply voltage supplying line in the test mode and disconnects the second external power supply voltage supplying line from the second internal power supply voltage supplying line in the normal mode. In the test mode, the first external power supply voltage supplying line is supplied with a second external power supply voltage and the second external power supply voltage supplying line is supplied with a third external power supply voltage the level of which is different from that of the second external power supply voltage. In the normal mode, the first and second external power supply voltage supplying lines are supplied with the first external power supply voltage.

Since the semiconductor integrated circuit device according to the second aspect of the present invention is provided with the first and second external power supply voltage supplying lines, the first and second external power supply voltages can be supplied in the test mode for reliability evaluation so that the difference between the second external power supply voltage and the first internal power supply voltage is equal to the difference between the third external power supply voltage and the second internal power supply voltage. Thus, in the semiconductor integrated circuit device according to the second aspect of the present invention, the conditions of stress for an internal circuit supplied with voltage from the first internal power supply voltage supplying line can be matched with those of stress for an internal circuit supplied with voltage from the second internal power supply voltage supplying line and thus a highly reliable test for evaluating reliability can be conducted.

Preferably, the semiconductor integrated circuit device according to the second aspect of the present invention further includes a third connecting element provided between the first external power supply voltage supplying line and the second external power supply voltage supplying line. The third connecting element disconnects the first external power supply voltage supplying line from the second external power supply voltage supplying line in the test mode and connects the first external power supply voltage supplying line to the second external power supply voltage supplying line in the normal mode.

Since the semiconductor integrated circuit device according to the second aspect of the present invention preferably includes the third connecting element, the first and second external power supply voltage supplying lines can be connected to each other in the normal mode. Thus, in the semiconductor integrated circuit device according to the second aspect of the present invention, electric field can be effectively relaxed when a surge is input.

A semiconductor integrated circuit device according to a third aspect of the present invention has a test mode for reliability evaluation and a normal mode. The semiconductor integrated circuit device includes a first internal power supply voltage generating circuit, a second internal power supply voltage generating circuit, a first connecting element, a second connecting element, and a down-converting element. The first internal power supply voltage generating circuit generates a first internal power supply voltage to be supplied to a first internal power supply voltage supplying line according to an external power supply voltage supplied from an external power supply voltage supplying line. The second internal power supply voltage generating circuit generates a second internal power supply voltage to be supplied to a second internal power supply voltage supplying line according to the external power supply voltage. The first connecting element is provided between the external power supply voltage supplying line and the first internal power supply voltage supplying line. The second connecting element is provided between the external power supply voltage supplying line and an intermediate node. The down-converting element is provided between the intermediate node and the second internal power supply voltage supplying line. The first and second internal power supply voltage generating circuits are inactivated in the test mode and activated in the normal mode. The first connecting element connects the external power supply voltage supplying line to the first internal power supply voltage supplying line in the test mode and disconnects the external power supply voltage supplying line from the first internal power supply voltage supplying line in the normal mode. The second connecting element connects the external power supply voltage supplying line to the intermediate node in the test mode and disconnects the external power supply voltage supplying line to the intermediate node in the normal mode. The down-converting element supplies a voltage down-converted from the external power supply voltage onto the second internal power supply voltage supplying line in the test mode.

Since the semiconductor integrated circuit device according to the third aspect of the present invention includes the down-converting element, the difference between the voltage down-converted from the external power supply voltage and the second internal power supply voltage can be rendered equal to the difference between the external power supply voltage and the first internal power supply voltage when the level of the first internal power supply voltage is higher than that of the second internal power supply voltage. Thus, in the semiconductor integrated circuit device according to the third aspect of the present invention, the conditions of stress for an internal circuit supplied with voltage from the first internal power supply voltage supplying line can be matched with those of stress for an internal circuit supplied with voltage from the second internal power supply voltage supplying line and thus a highly reliable test for evaluating reliability can be conducted.

A semiconductor integrate circuit device according to a fourth aspect of the present invention has a test mode for reliability evaluation and a normal mode. The semiconductor integrated circuit device includes a plurality of memory cells, a plurality of word lines, a plurality of driver circuits, a boosted voltage generating circuit and a test voltage supplying circuit. The plurality of memory cells are arranged in a matrix of rows and columns. Each word line is arranged corresponding to each row. Each word line is connected to corresponding memory cells. The driver circuits are provided corresponding to the word lines. The boosted voltage generating circuit generates boosted voltage and applies it to the driver circuits in the normal mode. The test voltage supplying circuit applies a first test voltage to each driver circuit via a voltage supplying line according to an external power supply voltage in the test mode for reliability evaluation. A driver circuit corresponding to a selected word line applies a voltage to the corresponding word line according to a boosted voltage in the normal mode. Each driver circuit supplies a voltage to a corresponding word line according to the first test voltage in the test mode. The test voltage supplying circuit includes a current limiting circuit for limiting current flowing into the voltage supplying line.

In the semiconductor integrated circuit device according to the fourth aspect of the present invention, current flowing into the voltage supplying line is limited in applying the first test voltage to the drive circuits via the voltage supplying line in the test mode for reliability evaluation. Thus, the semiconductor integrated circuit device according to the fourth aspect of the present invention, an excess current can be prevented from flowing into the voltage supplying line, removing defective chips.

Preferably, the semiconductor integrated circuit device according to the fourth aspect of the present invention further includes a plurality of pairs of bit lines. Each pair of bit lines is arranged corresponding to each column. Each pair of bit lines connects with memory cells of a corresponding column. A memory cell includes a memory cell transistor and a memory cell capacitor. The memory cell transistor has a control electrode connected to a corresponding word line, a first electrode connected to a corresponding bit line of a corresponding pair of bit lines, and a second electrode connected to one end of the memory cell capacitor. In the test mode, the other end of each memory cell capacitor receives a second test voltage and each pair of bit lines receives the ground voltage.

In the semiconductor integrated circuit device according to the fourth aspect of the present invention, preferably the other end of a memory cell capacitor receives a second test voltage and a pair of bit lines receives the ground voltage in supplying a voltage to a word line according to a boosted voltage in the test mode for reliability evaluation. Thus, in the semiconductor integrated circuit device according to the fourth aspect of the present invention, reliability testing of a gate oxide film of the memory cell transistor connected to the word line and reliability testing of the memory cell capacitor can be conducted simultaneously.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor integrated circuit device according to the present invention will now be described with reference to the figures.

[First Embodiment]

Figure 1:
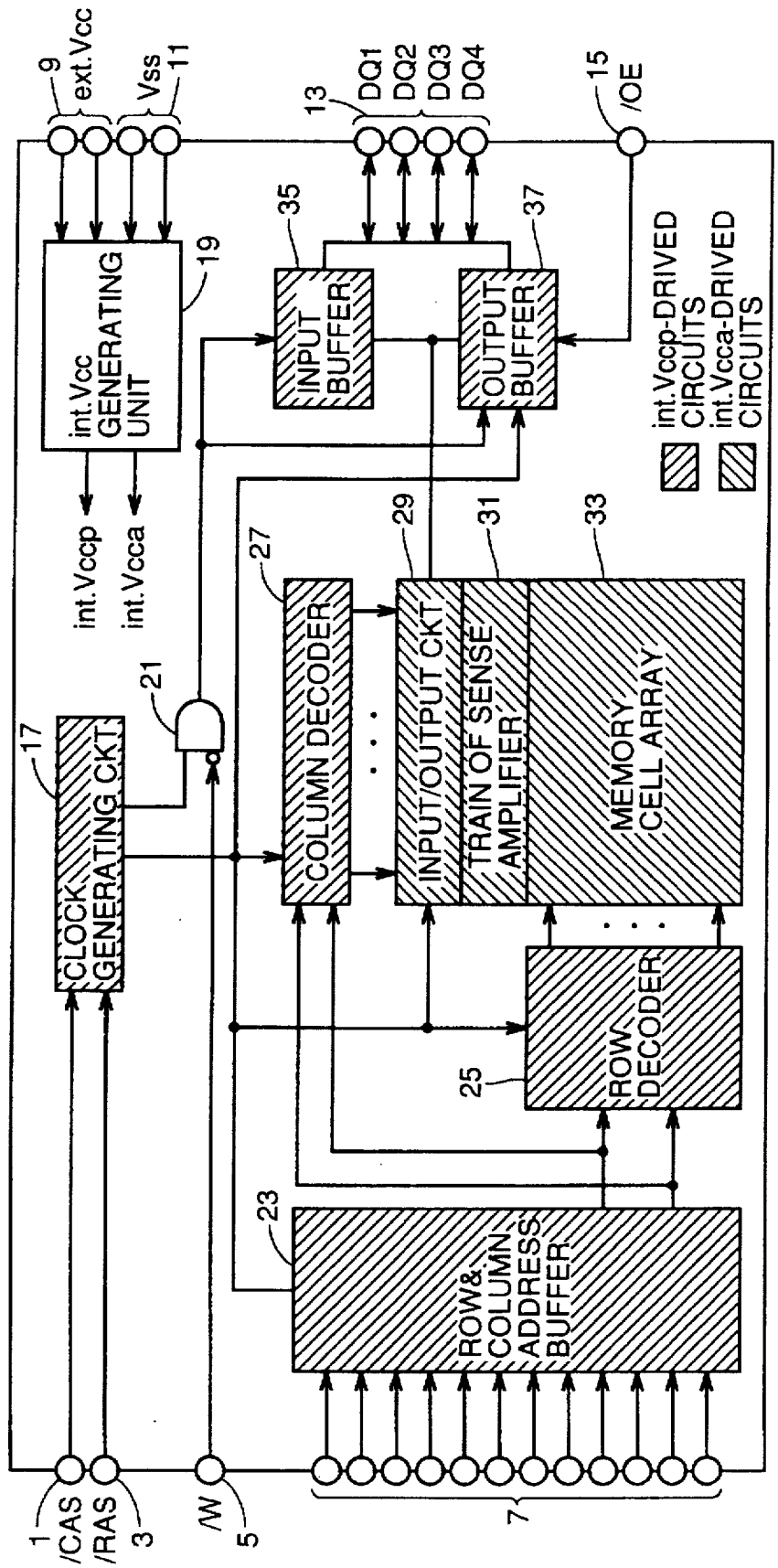
FIG. 1 is a schematic block diagram showing the entire configuration of a DRAM according to a first embodiment of the present invention.

FIG. 1 is a schematic block diagram showing the entire configuration of a dynamic random access memory. (referred to as a "DRAM" hereinafter) as a semiconductor integrated circuit device according to a first embodiment of the present invention. Referring to FIG. 1, the DRAM according to the first embodiment includes a clock generating circuit 17, a logic gate 21, a row and column address buffer 23, a row decoder 25, a column decoder 27, an input/output circuit 29, a train of sense amplifiers 31, a memory cell array 33, an input buffer 35, an output buffer 37, an intVcc generating unit 19, a /CAS input pad 1, a /RAS input pad 3, a /W input pad 5, a group of address signal input pads 7, a group of external power supply voltage input pads 9, a group of ground voltage input pads 11, a group of data input/output pads 13, and a /OE input pad 15. /CAS input pad 1 receives a column address strobe signal /CAS. /RAS input pad 3 receives a row address strobe signal /RAS. /W input pad 5 receives a write control signal /W. The group of address signal input pads 7 receives address signals $A_1$–$A_n$. The group of external power supply voltage input pads 9 receives an external power supply voltage extVcc. The group of ground voltage input pads 11 receives an ground voltage Vss. The group of data input/output pads 13 receives input data DQ1–DQ4 or outputs output data DQ–DQ4. /OE input pad 15 receives an output enable signal /OE.

In memory cell array 33, a plurality of word lines (not shown) are arranged in the row direction and a plurality of pairs of bit lines (not shown) are arranged in the column direction. A plurality of memory cells (not shown) are arranged at cross points of the plurality of word lines and the plurality of pairs of bit lines, respectively. Hereinafter, the operation of the DRAM in the normal mode, which does not include a test mode for reliability evaluation, will be described. Row decoder 25 selects one of the plurality of word lines in response to a row address signal input from row and column address buffer 23 and drives the word line. Column decoder 27 selects one pair of the plurality of pairs of bit lines in response to a column address signal input from row and column address buffer 23. The train of sense amplifiers 31 has a plurality of sense amplifiers (not shown). The plurality of sense amplifiers correspond to the plurality of pairs of bit lines. Each sense amplifier amplifies the difference in electric potential between the bit lines of a corresponding pair of bit lines. Input/output circuit 29 supplies the voltage of the pair of bit lines selected by column decoder 27 to output buffer 37. Output buffer 37 amplifies the supplied voltage and externally outputs it as output data DQ1–DQ4. Input buffer 35 amplifies input data DQ1–DQ4 supplied externally. Input/output circuit 29 supplies the input data amplified in input buffer 35 to a pair of bit lines selected by column decoder 27. Row and column address buffer 23 selectively inputs externally supplied address signals $A_1$–$A_n$ to row decoder 25 and column decoder 27. Clock generating circuit 17 generates various internal control signals in response to the row address strobe signal /RAS and the column address strobe signal /CAS or the like. IntVcc generating unit 19 generates internal power supply voltages intVccp and intVcca. Input/output circuit 29, the train of sense amplifiers 31 and memory cell array 33 receive the internal power supply voltage intVcca, which is lower than the internal power supply voltage intVccp, for reduction in power consumption. Clock generating circuit 17, row and column address buffer 23, row decoder 25, column decoder 27, input buffer 35 and output buffer 37 receive the internal power supply voltage intVccp, which is larger than the internal power supply voltage intVcca, to achieve fast operation.

Figure 2:
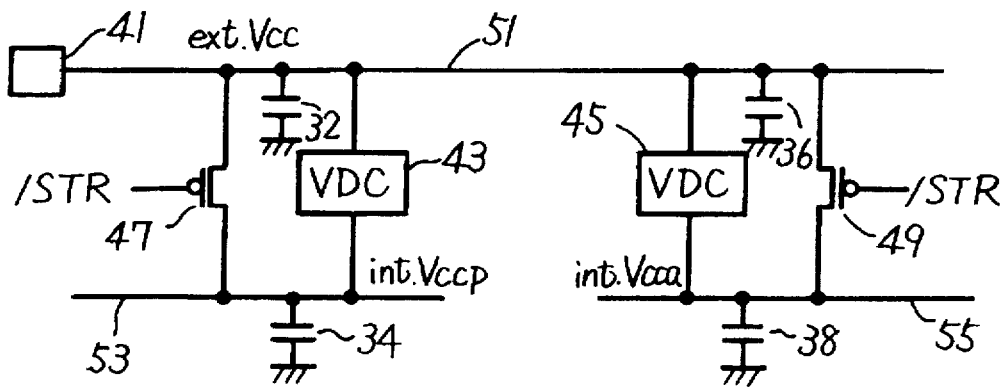
FIG. 2 schematically shows a portion of the DRAM according to the first embodiment of the present invention.

FIG. 2 schematically shows a portion of the DRAM shown in FIG. 1. Referring to FIG. 2, the DRAM shown in FIG. 1 includes capacitors 32, 34, 36 and 38, voltage-down converters (VDC) 43 and 45, a power supply pad 41, and PMOS transistors 47 and 49. Voltage-down converters 43 and 45 configure intVcc generating unit 19 shown in FIG. 1. PMOS transistor 47 is provided between an external power supply voltage supply line 51 and an internal power supply voltage supplying line 53. PMOS transistor 47 receives a burn-in mode detecting signal /STR at its gate. Voltage-down converter 43 is provided between external power supply voltage supplying line 51 and internal power supply voltage supplying line 53. PMOS transistor 49 is provided between external power supply voltage supplying line 51 and an internal power supply voltage supplying line 55. PMOS transistor 49 receives the burn-in mode detecting signal /STR at its gate. Voltage-down converter 45 is provided between external power supply voltage supplying line 51 and internal power supply voltage supply line 55. Capacitors 32 and 36 are provided between external power supply voltage supplying line 51 and nodes at the ground voltage, respectively. Capacitor 38 is provided between internal power supply voltage supplying line 55 and a node at the ground voltage. Capacitor 34 is provided between internal power supply voltage supplying line 53 and a node at the ground voltage.

External power supply voltage supplying 51 receives an external power supply voltage extVcc via power supply pad 41. In the normal mode (read out operation, write operation or the like), which does not include the test mode for evaluating reliability (burn-in test mode, for example), the burn-in mode detecting signal /STR is set to a high level and PMOS transistors 47 and 49 are turned off. Therefore, external power supply voltage supplying line 51 is disconnected from internal power supply voltage supplying lines 53 and 55. The operation of voltage-down converters 43 and 45 in the normal mode will now be described. Voltage-down converter 43 down-converts the external power supply voltage extVcc to generates and supply an internal power supply voltage intVccp onto internal power supply voltage supplying line 53. Voltage-down converter 45 down-converts the external power supply voltage extVcc to generate and supply an internal power supply voltage intVcca to internal power supply voltage supplying line 55. Internal power supply voltage supplying line 53 supplies the larger internal power supply voltage intVccp to clock generating circuit 17, row and column address buffer 23, column decoder 27, row decoder 25, input buffer 35 and output buffer 37. Internal power supply voltage supplying line 55 supplies the smaller internal power supply voltage intVcca to input/output circuit 29, the train of sense amplifiers 31 and memory cell array 33. Thus, the different voltage-down converters 43 and 45 apply the different internal power supply voltages intVccp and intVcca to their corresponding internal circuits according to the same external power supply voltage extVcc. For this reason, internal power supply voltage supplying lines 53 and 55 are disconnected from each other.

In burn-in test (in a test for evaluating reliability), voltage-down converters 43 and 45 are inactivated. Furthermore, since the burn-in mode detecting signal /STR is set to a low level in the burn-in test, PMOS transistors 47 and 49 are turned on. Thus, in the burn-in test, external power supply voltage supplying line 51 is connected to internal power supply voltage supplying lines 53 and 55 and internal power supply voltage supplying lines 53 and 55 directly receive the external power supply voltage extVcc. The reason why the external power supply voltage extVcc is directly supplied onto internal power supply voltage supplying lines 53 and 55 in burn-in test is as follows: since voltage-down converters 43 and 45 contemplate down-converting the external power supply voltage extVcc to transfer constant internal power supply voltages intVccp and intVcca to their corresponding internal circuits, a sufficiently high electric field, that is, a sufficiently high voltage cannot be supplied to the internal circuits.

Power supply pad 41 is included in the group of external power supply voltage input pads 9 shown in FIG. 1. Capacitors 32, 34, 36 and 38 are provided for relaxing electric field when a surge such as static electricity is input to power supply pad 41. That is, capacitors 32, 34, 36 and 38 are those for preventing coupling which are intentionally inserted for accommodating noises. Capacitors 32 and 36 each have a capacitance of approximately several hundreds pF and capacitors 34 and 38 each have a capacitance of approximately several thousands pF. Capacitors 32, 34, 36 and 38 are MOS capacitors.

Figure 3:
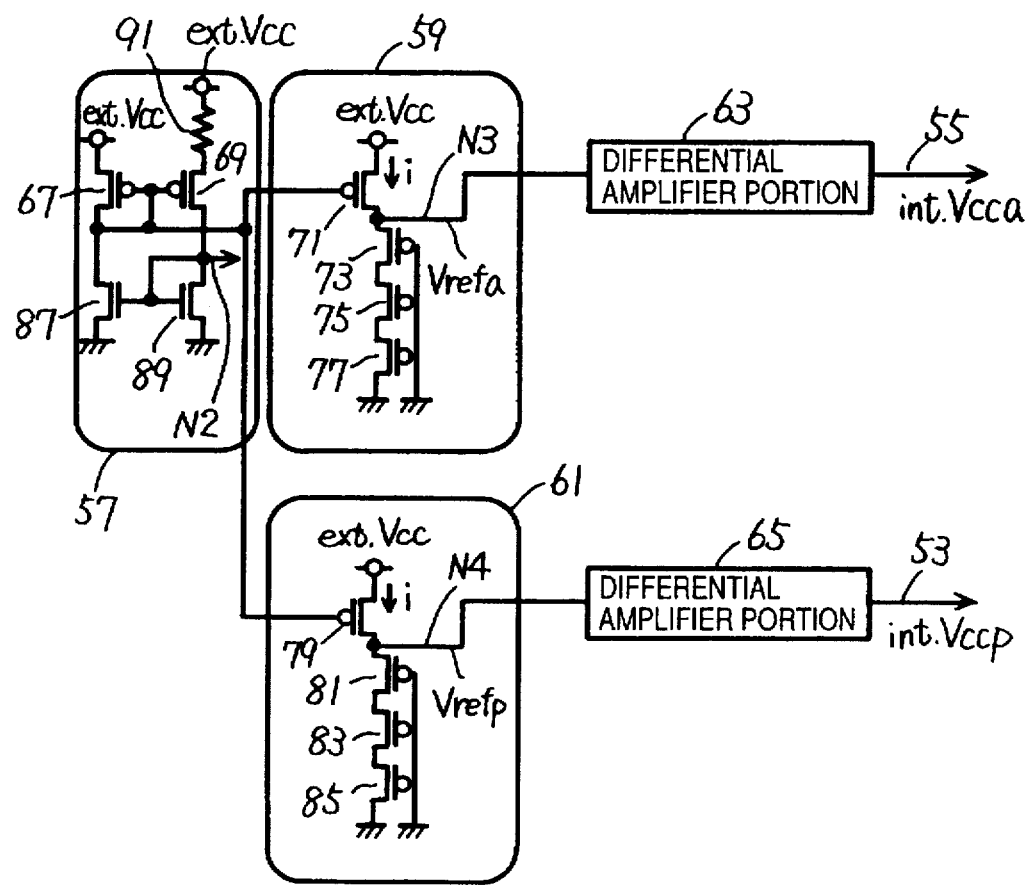
FIG. 3 is a circuit diagram showing the intVcc generating unit shown in FIG. 1 in detail.

FIG. 3 is a circuit diagram showing in detail a voltage-down converters 43 and 45 (intVcc generating unit 19 shown in FIG. 1). The portions which are similar to those shown in FIG. 2 are labeled with the identical reference characters and the description thereof is, where appropriate, not repeated. Referring to FIGS. 2 and 3, voltage-down converter 43 includes a constant-current source 57, a Vrefp generating circuit 61 and a differential amplifier portion 65. Voltage-down converter 45 includes constant-current source 57, a Vrefa generating circuit 59 and a differential amplifier portion 63. Constant-current source 57 is shared by voltage-down converters 43 and 45. Constant-current source 57 includes PMOS transistors 67 and 69, NMOS transistors 87 and 89, and a resistance element 91. PMOS transistor 67 and NMOS transistor 87 are connected in series between a node at the external power supply voltage extVcc and a node at the ground voltage. Resistance element 91, PMOS transistor 69 and NMOS transistor 89 are connected in series between a node at the external power supply voltage extVcc and a node at the ground voltage. The gate and drain of PMOS transistor 67 and the gate of PMOS transistor 69 are connected to the gates of PMOS transistors 71 and 79. The gates of NMOS transistors 87 and 89 are connected to the drain (a node N2) of NMOS transistor 89.

Vrefa generating circuit 59 includes PMOS transistors 71, 73, 75 and 77. PMOS transistors 71, 73, 75 and 77 are connected in series between a node at the external power supply voltage extVcc and a node at the ground voltage. The gates of PMOS transistors 73–77 are connected to a node at the ground voltage. A node N3 is connected to differential amplifier portion 63. The potential of node N3 serves as the reference voltage Vrefa. Vrefp generating circuit 61 includes PMOS transistors 79, 81, 83 and 85. PMOS transistors 79–85 are connected in series between a node of the external power supply voltage extVcc and a node at the ground voltage. The gates of PMOS transistors 81–85 are connected to a node at the ground voltage. A node N4 is connected to differential amplifier portion 65. The potential of node N4 will serve as the reference voltage Vrefp.

A constant current i, which does not much depend on the external power supply voltage extVcc, is generated at constant-current source 57 and is input to Vrefa generating circuit 59 and Vrefp generating circuit 61. In Vrefa generating circuit 59, the input, constant current i is transformed into a voltage by the channel resistance of PMOS transistors 71–77. Meanwhile, in Vrefp generating circuit 61, the input, constant current i is transformed into a voltage by the channel resistance of PMOS transistors 79–85. Now, the total of the general resistances of three PMOS transistors 73–77 is indicated as a channel resistance ra and that of the total of the channel resistances of three PMOS transistors 81–85 is indicated as a channel resistance rp. The value of the channel resistance ra is set to be different from that of the channel resistance rp. Thus, a reference voltage Vrefa (the potential of node N3) generated by Vrefa generating circuit 59 is i×ra and a reference voltage Vrefp (the potential of node N4) generated by Vrefp generating circuit 61 is i×rp so that the value of the reference voltage Vrefa can be different from that of the reference voltage Vrefp. The reference voltage Vrefa generated from Vrefa generating circuit 59 is input to differential amplifier portion 63. The reference voltage Vrefp generated from Vrefp generated circuit 61 is input to differential amplifier portion 65.

Figure 4:
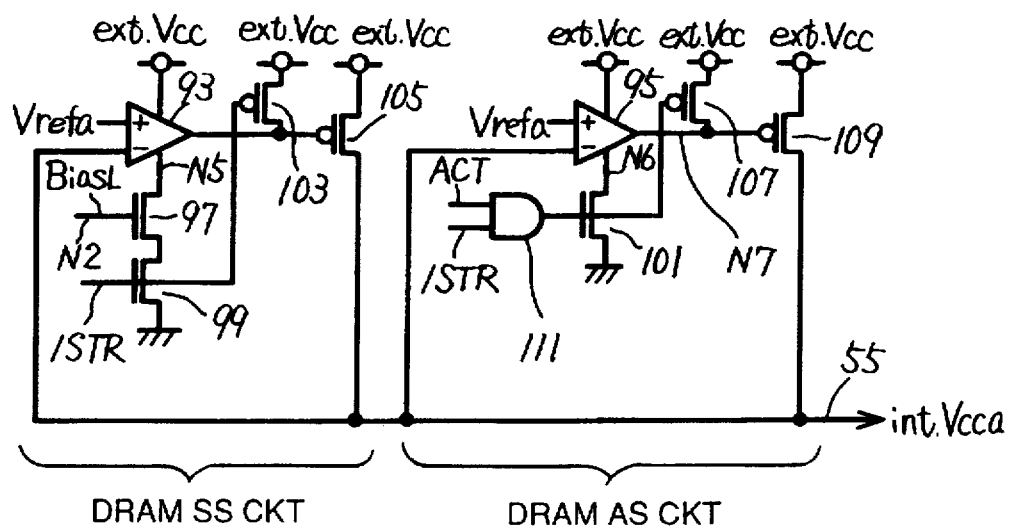
FIG. 4 is a circuit diagram showing in detail a differential amplifier portion which generates an internal power supply voltage intVcca shown in FIG. 3.

FIG. 4 is a circuit diagram showing in detail differential amplifier portion 63 shown in FIG. 3. The portions which are similar to those shown in FIG. 3 are labeled with the identical reference characters and the description thereof is, where appropriate, not repeated.

Referring to FIG. 4, the differential amplifier portion which generates the internal power supply voltage intVcc to be supplied to memory cell array 33 (FIG. 1) or the like is configured by a DRAM-on-standby-state (DRAM SS) circuit and a DRAM-on-active-state (DRAM AS) circuit. The DRAM SS circuit operates when the DRAM is on the standby and active state. The DRAM AS circuit operates when the DRAM is on the active state. The DRAM SS circuit includes a differential amplifier 93, PMOS transistors 103 and 105, and NMOS transistors 97 and 99. Differential amplifier 93 is provided between a node at the external power supply voltage Vcc and a node N5. One input node of differential amplifier 95 receives the difference voltage Vrefa. The other input node of differential amplifier 93 is connected to internal power supply voltage supplying line 55. An output node of differential amplifier 93 is connected to the gate of PMOS transistor 105. NMOS transistors 97 and 99 are connected in series between node N5 and a node at the ground voltage. The gate of NMOS transistor 97 is connected to node N2 of constant-current source 57 shown in FIG. 3. The size of NMOS transistor 97 is the same as that of NMOS transistors 87 and 89 shown in FIG. 3. NMOS transistor 99 receives the burn-in mode detecting signal /STR at its gate. PMOS transistor 103 is provided between a node at the external power supply voltage extVcc and the output node of differential amplifier 93. PMOS transistor 103 receives the burn-in mode detecting signal /STR at its gate. PMOS transistor 105 is provided between a node at the external power supply voltage extVcc and internal power supply voltage supplying line 55.

The DRAM AS circuit includes an AND circuit 111, a differential amplifier 95, an NMOS transistor 101, and PMOS transistors 107 and 109. One input node of AND circuit 111 receives a signal ACT. The other input node of AND circuit 111 receives the burn-in mode detecting signal /STR. An output node of AND circuit 111 is connected to the gates of NMOS transistor 101 and PMOS transistor 107. NMOS transistor 101 is provided between a node N6 and a node at the ground voltage. Differential amplifier 95 is provided between a node at the external power supply voltage extVcc at node N6. One input node of differential amplifier 95 receives the reference voltage Vrefa. The other input node of differential amplifier 95 is connected to internal power supply voltage supplying line 55. An output node N7 of differential amplifier 95 is connected to the gate of PMOS transistor 109. PMOS transistor 107 is provided between a node at the external power supply voltage extVcc and node N7. PMOS transistor 109 is provided between a node at the external power supply voltage extVcc and internal power voltage supplying line 55. The DRAM SS circuit and the DRAM AS circuit are feed back type circuits which adjust the level of the internal power supply voltage intVcca by comparing the internal power supply voltage intVcca with the reference voltage Vrefa at their respective differential amplifiers 93 and 95 and controlling their respective PMOS transistors 105 and 109 which receive the outputs of their respective differential amplifiers 93 and 95. Since the burn-in mode detecting signal /STR is set to a low level in a burn-in test, NMOS transistors 99 and 101 turn off. Furthermore, since PMOS transistors 103 and 107 turn on, PMOS transistors 105 and 109 turn off. Thus, the DRAM SS and AS circuits are inactivated in the burn-in test. The reason for provision of PMOS transistor 107 is as follows: since the potential of node N7 is not determined at one value when the burn-in mode detecting signal /STR is at a low level or the signal ACT is at a low level, PMOS transistor 109 is forced to be turned off to inactivate the DRAM AS circuit. PMOS transistor 103 is provided for the same reason.

The operation of the DRAM SS circuit and the DRAM AS circuit in the normal mode will now be described. In the normal mode, the burn-in mode detecting signal /STR is set to a high level (CMOS level). Thus, NMOS transistor 99 turns on and PMOS transistor 103 turns off. While the DRAM SS circuit is required to always operate in the normal mode, differential amplifier 93 has a current flowing therethrough limited by a constant intermediate voltage BiasL for reduction in power consumption. Meanwhile, the DRAM AS circuit is activated for only a period during which the chip consumes large current. Since the burn-in mode detecting signal /STR is set to a high level and the signal ACT is set to a high level (CMOS level) in the normal mode for a period during which the chip consumes large current, NMOS transistor 101 turns on and PMOS transistor 107 turns off. A period during which the chip consumes large current is the time of sensing, for example. The DRAM AS circuit consumes larger current than the DRAM SS circuit but is designed to rapidly operate by high driving ability. The signal ACT is set to a low level in the normal mode for a period during which the chip does not consume large current and thus NMOS transistor 101 turns off and PMOS transistor 107 turns on. Thus, the DRAM AS circuit is inactivated.

While activation/inactivation of the DRAM AS circuit is controlled by the AND signal of the signal ACT and the burn-in mode detecting signal /STR, activation/inactivation of the DRAM SS circuit is controlled without using any AND circuits. This is because NMOS transistor 97 is controlled by the intermediate voltage BiasL. The configuration and operation of differential amplifier portion 65 shown in FIG. 3 are similar to those of the differential amplifier portion of FIG. 4 (differential amplifier portion 63 shown in FIG. 3). The DRAM AS circuit in differential amplifier portion 65 shown in FIG. 3 is activated in the normal mode only for a period during which the chip consumes large current, which is similar to the DRAM AS circuit in differential amplifier portion 63. A period during which a chip consumes large current is that during which the row address strobe signal /RAS is activated, for example.

Figure 5:
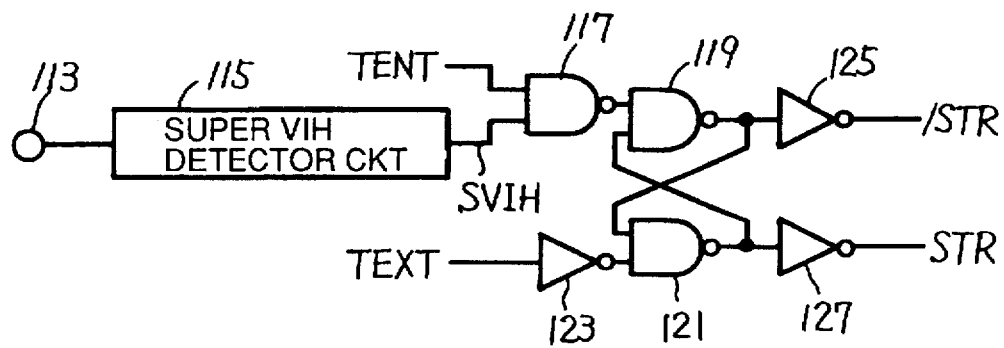
FIG. 5 is a circuit diagram showing in detail a burn-in mode detecting signal generating circuit for generating a burn-in mode detecting signal /STR shown in FIG. 2.

FIG. 5 is a circuit diagram showing in detail a burn-in mode detecting signal generating circuit for generating the burn-in mode detecting signal /STR. Referring to FIG. 5, the burn-in mode detecting signal generating circuit includes a super VIH detector circuit 115, NAND circuits 117, 119 and 121, and inverters 123, 125 and 127. Super VIH detector circuit 115 is connected to an address signal input pad 113. Address signal input pad 113 is included in the group of address signal input pads 7 shown in FIG. 1. For example, address signal input pad 113 is an address signal input pad which receives an address signal $A_1$ in the normal mode. One input mode of NAND circuit 117 receives a test mode entry signal TENT and the other input node receives a signal SVIH from super VIH detector circuit 115. One input node of NAND circuit 119 is connected to an output node of NAND circuit 117. An output node of NAND circuits 119 is connected to an input node of inverter 125. An output node of inverter 125 outputs the burn-in mode detecting signal /STR. An input node of inverter 123 receives a test mode exit signal TEXT. One input node of NAND circuit 121 is connected to an output node of inverter 123. An output node of NAND circuit 121 is connected to an input node of inverter 127. An output node of inverter 127 outputs a signal STR the level of which is the inverted level of the burn-in mode detecting signal /STR. NAND circuits 119 and 121 form a set/reset flip-flop circuit.

Figure 6:
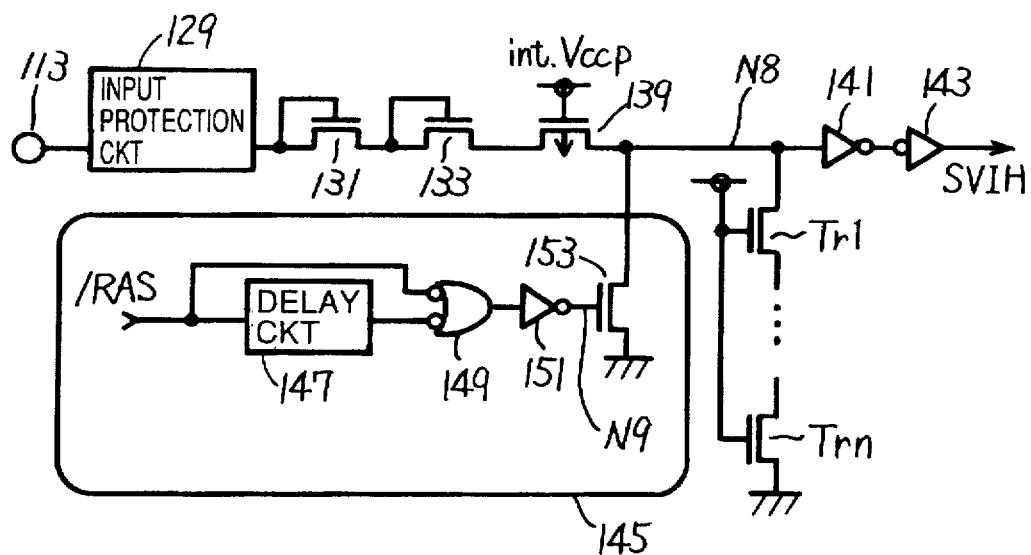
FIG. 6 is a circuit diagram showing in detail the super VIH detector circuit shown in FIG. 5.

FIG. 6 is a circuit diagram showing the detail of super VIH detector circuit 115 sown in FIG. 5. The portions which are similar to those shown in FIG. 5 are labeled with the identical reference characters and the description thereof is, where appropriate, not repeated. Referring to FIG. 6, the super VIH detector circuit includes an input protection circuit 129, NMOS transistors 131, 133, Tr1, . . . , Trn, a PMOS transistor 139, inverters 141 and 143, and a reset circuit 145. Input protection circuit 129 is connected to address signal input pad 113. NMOS transistors 131 and 133 and PMOS transistor 139 are connected in series between a node N8 and input protection circuit 129. NMOS transistors 131 and 133 are connected to form a diode. The gate of PMOS transistor 139 receives the internal power supply voltage intVccp. Node N8 is connected to an input node of inverter 141. An output node of inverter 141 is connected to an input node inverter 143. An output node of inverter 143 outputs the signal SVIH. The signal SVIH is input to NAND circuit 117 shown in FIG. 5. NMOS transistors Tr1, . . . , Trn are connected in series between node N8 and a node at the ground voltage. The gates of NMOS transistors Tr1, . . . , Trn receive the internal power supply voltage intVccp. Reset circuit 145 includes a delay circuit 147, a logic gate 149, an inverter 151 and an NMOS transistor 153. An input node of delay circuit 147 receives the row address strobe signal /RAS. One input node of logic gate 149 receives the row address strobe signal /RAS and the other input node receives a delayed, row address strobe signal /RAS. An output node of logic gate 129 is connected to an input node of inverter 151. An output node of inverter 151 is connected to the gate of NMOS transistor 153. NMOS transistor 153 is provided between node N8 and a node at the ground voltage.

A technique referred to as super VIH detection is employed in detecting a change-over to the burn-in mode in a chip after molding. For example, a DRAM according to the first embodiment adopts the configuration in which the current mode is switched to the burn-in mode when a particular address signal input pad receives an excess voltage which is higher than the high level of the normal external power supply voltage extVcc. Referring to FIG. 6, the operation of the super VIH detector circuit including the detection of the burn-in mode will now be described. In the normal mode, node N8 is held at a low level through NMOS transistors Tr1, . . . , Trn provided as resistance. Thus, the signal SVIH is also held at a low level in the normal mode. Each of NMOS transistors Tr1, . . . , Trn has its resistance value increased for reduction in power consumption. When an excess voltage is input to address signal input pad 113 and a voltage down-converted at the two NMOS transistors 131 and 133 is sufficiently larger than the internal power supply voltage intVccp, PMOS transistor 139 turns on and a sufficient voltage is supplied as that at the high level to node N8. Accordingly, the signal SVIH is also set to a high level. Thus, the burn-in mode can be detected without adding any dedicated pads. However, since with this condition, only the fractional current flowing through NMOS transistors Tr1, . . ., Trn can reset the circuit, the super VIH detector circuit has reset circuit 145. At the end of an active cycle, a pulse is generated at node N9 at the timing of rising of the low address strobe signal /RAS to lower the level of node N8 to the low level so that NMOS transistor 153 having a larger driving force than PMOS transistor 139 turns on. This allows fast resetting of the super VIH detecting circuit.

Referring to FIG. 5, the operation of the burn-in mode detecting signal generating circuit will now be described. For a chip after molded, not only a burn-in test but also other tests may be conducted. A mode in which various tests are conducted is generally referred to as a test mode. When the test mode entry signal TENT is at a high level and the signal SVIH from super VIH detector circuit 115 is at a high level, the set/reset flip-flop circuit formed of NAND circuits 119 and 121 is set. This sets the burn-in mode detecting signal /STR to a low level and the signal STR to a high level. On the other hand, the set/reset flip-flop circuit formed of NAND circuit 119 and 121 is reset by the test mode exit signal TEXT of the high level. This sets the burn-in mode detecting signal /STR to a high level and the signal STR to a low level. The test mode entry signal TENT and the test mode exit signal TEXT may be generated by various methods. For example, the test mode entry signal TENT is set to a high level at the timing of WCTR (/W, /CAS before /RAS) to enter the test mode, and the test mode exit signal TEXT is set to a high level at the timing of CBR (/CAS before /RAS) to exit the test mode.

As described above, the DRAM according to the first embodiment includes voltage-down converter 43 which supplies the internal power supply voltage intVccp to the peripheral circuitry (clock generating circuit 17, row and column address buffer 23, row decoder 24, column decoder 27, input buffer 35 and output buffer 37), and voltage-down converter 45 which supplies the internal power supply voltage intVcca to input/output circuit 29, the train of sense amplifiers 31 and memory cell array 33. Furthermore, NMOS transistors 47 and 49 are provided corresponding to voltage-down converters 43 and 45, and the external power supply voltage extVcc is directly supplied to internal power supply voltage supplying lines 53 and 55 in a burn-in test through NMOS transistors 47 and 49. Thus, fast operation and reduction in power consumption can be achieved and an effective burn-in test can be conducted in the DRAM according to the first embodiment.

[Second Embodiment]

Referring to FIG. 2, the internal power supply voltage intVccp is larger than the internal power supply voltage intVcca. Thus, when the same external power supply voltage extVcc is supplied on internal power supply voltage supplying lines 53 and 55 in a burn-in test, the conditions of stress for internal circuits supplied with a voltage from internal power supply voltage supplying line 53 are different from those of stress for internal circuits supplied with a voltage from internal power supply voltage supplying line 55. A DRAM as a semiconductor integrated circuit device according to a second embodiment of the present invention is directed to matching the conditions of stress for internal circuits supplied with a voltage from internal power supply voltage supplying line 53 with those of stress for internal circuits supplied with a voltage from internal power supply voltage supplying line 55.

Figure 7:
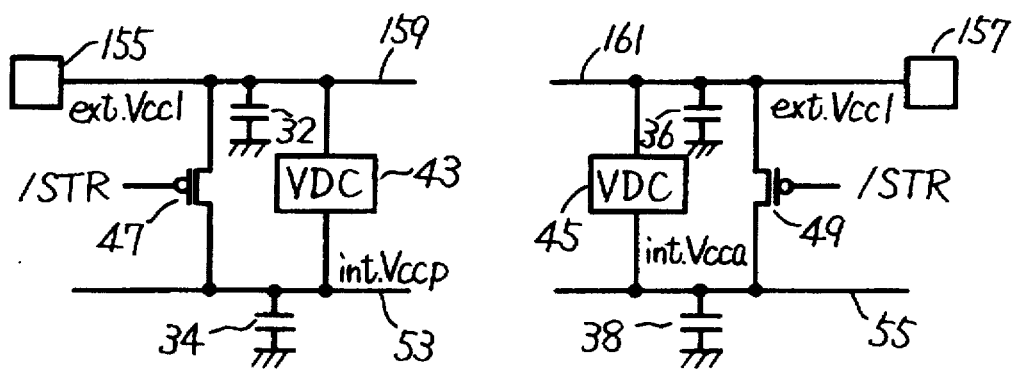
FIGS. 7, 8 and 9 schematically show a portion of DRAMs according to second, third and fourth embodiments of the present invention, respectively.

The entire configuration of the DRAM according to the second embodiment is similar to the entire configuration of the DRAM according to the first embodiment (FIG. 1). FIG. 7 schematically shows a portion of the DRAM according to the second embodiment. The portions which are similar to those shown in FIG. 2 are labeled with the identical reference characters and the description thereof is, where appropriate, not repeated. Referring to FIG. 7, the DRAM according to the second embodiment includes power supply pads 155 and 157, capacitors 32, 34, 36 and 38, voltage-down converters 43 and 45, and PMOS transistors 47 and 49. Voltage-down converter 43 is provided between an external power supply voltage supplying line 159 and an internal power supply voltage supplying line 53. PMOS transistor 47 is provided between external power supply voltage supplying line 159 and an internal power supply voltage supplying line 53. PMOS transistor 47 receives the burn-in mode detecting signal /STR at its gate. External power supply voltage supplying line 159 is supplied with an external power supply voltage via power supply pad 155. Voltage-down converter 45 is provided between an external power supply voltage supplying line 161 and an internal power supply voltage supplying line 55. PMOS transistor 49 is provided between external power supply voltage supplying line 161 and internal power supply voltage supplying line 55. The gate of PMOS transistor 49 receives the burn-in mode detecting signal /STR. Capacitor 32 is provided between external power supply voltage supplying line 159 and a node at the ground voltage. Capacitor 36 is provided between external power supply voltage supplying line 161 and a node at the ground voltage. External power supply voltage supplying line 161 is supplied with the external power supply voltage via pad 157. The burn-in mode detecting signal generating circuit for generating the burn-in mode detecting signal /STR is similar to the burn-in mode detecting signal generating circuit shown in FIGS. 5 and 6.

The operation of the normal mode will now be described. From pads 155 and 157, an external power supply voltage extVcc 1 is supplied to external power supply voltage supplying lines 159 and 161. Since the burn-in mode detecting signal /STR is at a high level, PMOS transistors 47 and 49 are turned off. Thus, voltage-down converter 43 down-converts the external power supply voltage extVcc 1 to supply an internal power supply voltage intVccp to internal power supply voltage supplying line 53. Meanwhile, voltage-down converter 45 down-converts the external power supply voltage extVcc 1 to generate and supply an internal power supply voltage intVcca to internal power supply voltage supplying line 55. Here, the internal power supply voltage intVccp is larger than the internal power supply voltage intVcca. The other operations and the manner in which the external power supply voltage extVcc 1 from pads 155 and 157 is applied are similar to those of the DRAM according to the first embodiment.

The operation in a burn-in test will now be described. Voltage-down converters 43 and 45 are inactivated. Since the burn-in mode detecting signal /STR is at a low level, PMOS transistors 47 and 49 are turned on. Then, internal power supply voltage supplying lines 53 receives an external power supply voltage extVcc 2 via pad 155, external power supply voltage supplying line 159 and PMOS transistor 47. Meanwhile, internal power supply voltage supplying line 55 receives an external power supply voltage extVcc 3 via pad 157, external power supply voltage supplying line 161 and PMOS transistor 49. The external power supply voltages extVcc 2 and extVcc 3 are supplied from pads 155 and 157 to external power supply voltage supplying lines 159 and 161 so that the difference between the external power supply voltage extVcc 2 and the internal power supply voltage intVccp is equal to the difference between the external power supply voltage extVcc 3 and the internal power supply voltage intVcca. That is, the external power supply voltages extVcc 2 and extVcc 3 are supplied from pads 155 and 157 to external power supply voltage supplying lines 159 and 161 so that (extVcc 2−intVccp)=(extVcc 3−intVcca). That is, the conditions of stress for a circuit supplied with a voltage from internal power supply voltage supplying line 53 are matched with those of stress for a circuit supplied with a voltage from internal power supply voltage supplying line 55. The other operations and the manner in which the external power supply voltages extVcc 2 and extVcc 3 are applied from pads 155 and 157 at the time of a burn-in test are similar to those of the DRAM according to the first embodiment.

As described above, the DRAM according to the second embodiment is provided with two external power supply voltage supplying lines corresponding to internal power supply voltage supplying lines 53 and 38. This allows the conditions of stress for a circuit supplied with a voltage from internal power supply voltage supplying line 53 to be matched with those of stress for a circuit supplied with a voltage from internal power supply voltage supplying line 55. Thus, a more reliable burn-in acceleration test can be conducted in the DRAM according to the second embodiment than that according to the first embodiment, and still an effect similar to that of the DRAM according to the first embodiment can be achieved.

[Third Embodiment]

Figure 8:
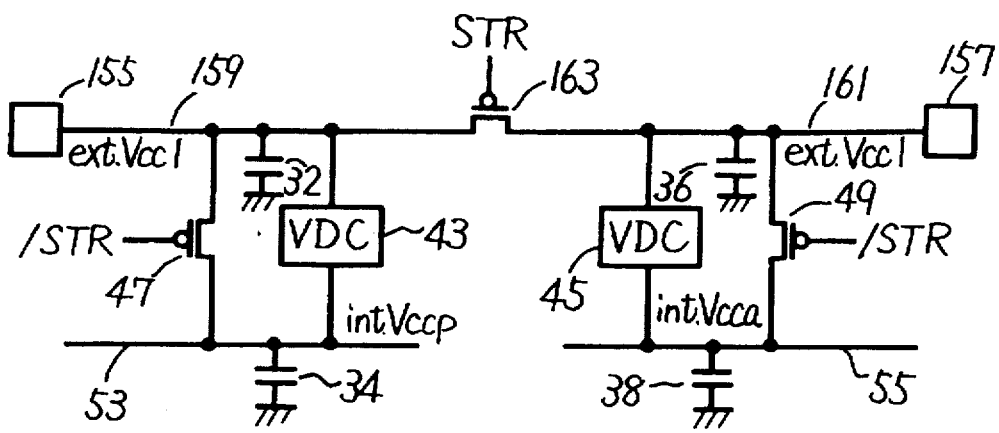

The entire configuration of a DRAM as a semiconductor integrated circuit device according to a third embodiment is similar to that of the DRAM according to the first embodiment (FIG. 1). FIG. 8 schematically shows a portion of the DRAM according to the third embodiment. The portions which are similar to those shown in FIG. 7 are labeled with the identical reference characters and the description thereof is, where appropriate, not repeated. Provided between external power supply voltage supplying lines 159 and 161 is a PMOS transistor 163. PMOS transistor 163 receives the signal STR at its gate. A burn-in mode detecting signal generating circuit for generating the burn-in mode detecting signal /STR and the signal STR is similar to that shown in FIGS. 5 and 6.

Since the signal STR is at a low level in the normal mode, PMOS transistor 163 is turned on and external power supply voltage supplying lines 159 and 161 are connected to each other. On the other hand, since the signal STR is at a high level in a burn-in test, PMOS transistor 163 is turned off and external power supply voltage supplying lines 159 and 161 are disconnected from each other. External power supply voltage supplying lines 159 and 161 are thus disconnected from each other in a burn-in test to match the conditions of stress for a circuit supplied with a voltage from internal power supply voltage supplying line 53 with those of stress for a circuit supplied with a voltage from internal power supply voltage supplying line 55, which is similar to the DRAM according to the second embodiment. The connection of external power supply voltage supplying lines 159 with external power supply voltage supply line 161 is out of consideration for reliability of the chip. That is, when a surge such as static electricity is input to either power supply pad 155 or 157, connection of external power supply voltage supplying lines 159 and 161 would widen an area applied with a high voltage, achieving a more effective relaxation of electric field. For example, when a surge is input to power supply pad 155, electric field can be relaxed by two capacitors 32 and 36 since external power supply voltage supplying lines 159 and 161 are connected with each other. On the other hand, when a surge is input to power supply pad 155 in the circuit shown in FIG. 7, for example, electric field is relaxed only by capacitor 32 since external power supply voltage supplying lines 159 and 161 are disconnected from each other.

As described above, since the DRAM according to the third embodiment is provided with PMOS transistor 163, external power supply voltage supplying line 159 is connected with external power supply voltage supplying line 161 in the normal mode. Thus, when a surge is input to either pad 155 or 157, the electric field can be more effectively relaxed in the DRAM according to the third embodiment than in the DRAM according to the second embodiment.

Furthermore, in the DRAM according to the third embodiment, similar to the DRAM according to the second embodiment, external power supply voltage supplying lines 159 and 161 are disconnected with each other in a burn-in test and external power supply voltages extVcc 2 and extVcc 3 are supplied so that (extVcc 2−intVccp)=(extVcc 3−intVcca). This allows the conditions of stress for a circuit supplied with a voltage from internal power supply voltage supplying line 53 to be matched with those of stress for a circuit supplied with a voltage from internal power supply voltage supplying line 55 in the DRAM according to the third embodiment, and a more reliable burn-in acceleration test can be conducted as compared with the DRAM according to the first embodiment. Furthermore, an effect which is similar to that of the DRAM according to the first embodiment can be achieved.

[Fourth Embodiment]

Figure 9:
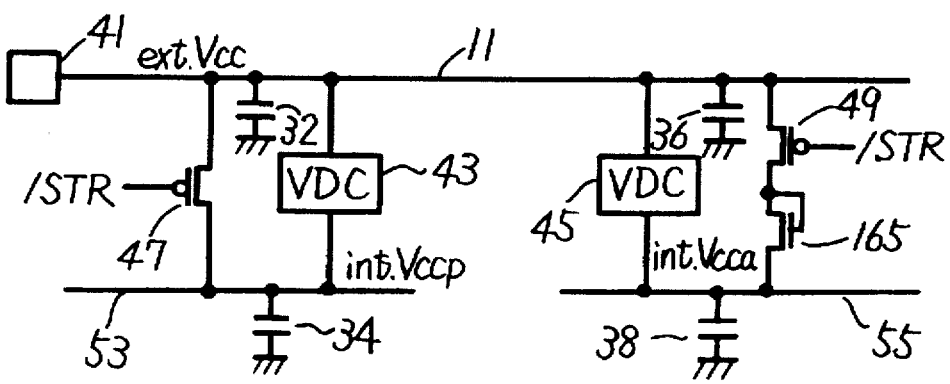

The entire configuration of a DRAM as a semiconductor integrated circuit device according to a forth embodiment is similar to that of the DRAM according to the first embodiment (FIG. 1). FIG. 9 schematically shows a portion of the DRAM according to the fourth embodiment. The portions which are similar to those shown in FIG. 2 are labeled with the identical reference characters and the description thereof is, where appropriate, not repeated. Referring to FIG. 9, a PMOS transistor 49 and an NMOS transistor 165 are connected in series between external power supply voltage supplying lines 11 and 55. PMOS transistor 49 receives the burn-in mode detecting signal /STR at its gate. NMOS transistor 165 is connected to form a diode. A burn-in mode detecting signal generating circuit for generating the burn-in mode detecting signal /STR is similar to that shown in FIGS. 5 and 6.

The burn-in mode detecting signal /STR is at a low level at the time of burn-in test. Accordingly, a voltage which is down-converted from an external power supply voltage extVcc by NMOS transistor 165 is supplied to internal power supply voltage supplying line 55. NMOS transistor 165 down-converts the external power supply voltage extVcc so that the difference between the voltage down-converted from the external power supply voltage extVcc and supplied to internal power supply voltage supplying line 55 and an internal power supply voltage intVcca is equal to the difference between the external power supply voltage extVcc and an internal power supply voltage intVccp. That is, the conditions of stress for a circuit supplied with a voltage from internal power supply voltage supplying line 53 is matched with those of stress for a circuit supplied with a voltage from internal power supply voltage supplying line 55 in a burn-in test. The other operations in a burn-in test are similar to those of the DRAM according to the first embodiment. The operation in the normal mode is also similar to that of the DRAM according to the first embodiment.

As described above, since the DRAM according to the fourth embodiment is provided with NMOS transistor 165 connected to form a diode, the conditions of stress for a circuit supplied with a voltage from internal power supply voltage supplying line 53 can be matched with those of stress for a circuit supplied with a voltage from internal power supply voltage supplying line 55 in a burn-in test. Thus, a more reliable burn-in acceleration test can be conducted in the DRAM according to the fourth embodiment than in the DRAM according to the first embodiment. Furthermore, an effect which is similar to that of the DRAM according to the first embodiment is achieved.

[Fifth Embodiment]

In a burn-in test, a plurality of word lines can be activated for a significant reduction in burn-in time and a pad can supply with a word line driving voltage, to conduct reliability testing of a gate oxide film. Such a mode is referred to as a mode for driving a plurality of word lines. In this example, the word line driving voltage is the same in magnitude as a boosted voltage Vpp generated by an internal boosted voltage generating circuit, since the internal boosted voltage generating circuit has an insufficient ability to supply the word line driving voltage from the pad.

Figure 10:
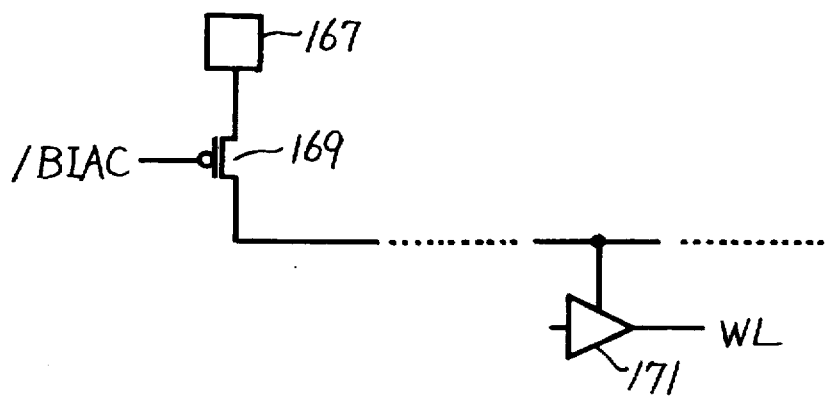
FIG. 10 illustrates a problem of a general DRAM in conducting a test for evaluating reliability.

FIG. 10 illustrates a problem in a general DRAM in a burn-in test. Referring to FIG. 10, the general DRAM includes a pad 167, a PMOS transistor 169 and a word driver 171. Since a signal /BIAC is set to a low level in the mode for driving a plurality of word lines, PMOS transistor 169 is turned on. Accordingly, a word line driving voltage is applied from pad 167 to word driver 171. In the circuit configuration shown in FIG. 10, however, an excess current could flow into an aluminum interconnection via pad 167 in the process of applying a first test voltage to word driver 171, and the temporarily generated excess current could result in a defective chip due to migration of the aluminum. A DRAM as a semiconductor integrated circuit device according to the fifth embodiment contemplates preventing such an excess current.

Figure 11:
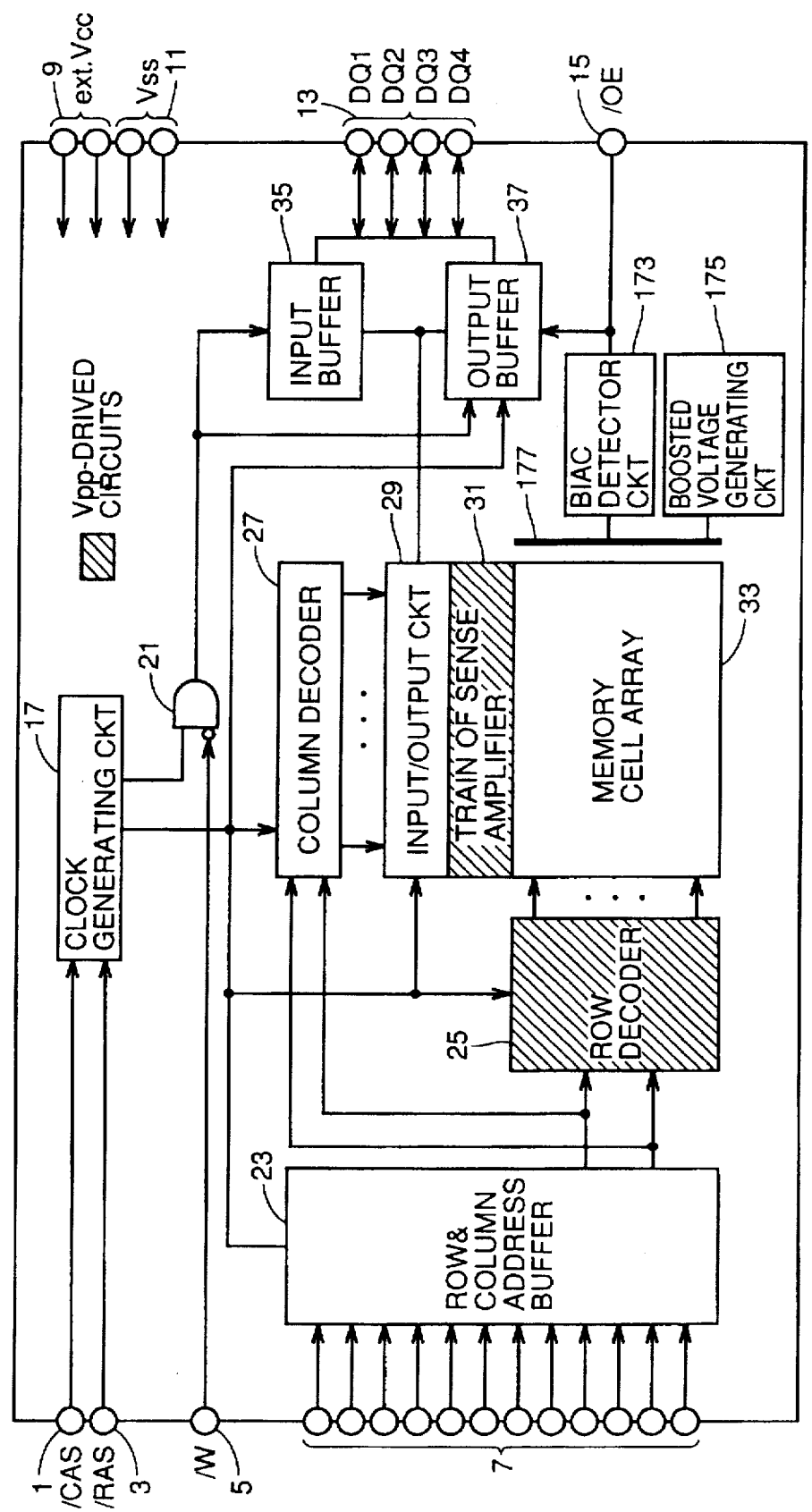
FIG. 11 is a schematic block diagram showing the entire configuration of a DRAM according to a fifth embodiment of the present invention.

FIG. 11 is a schematic block diagram showing the entire configuration of the DRAM according to the fifth embodiment. The portions which are similar to those shown in FIG. 1 are labeled with the identical reference characters and the description thereof is, where appropriate, not repeated. Referring to FIG. 11, the DRAM according to the fifth embodiment includes BIAC detector circuit (a test voltage supplying circuit) 123 and a boosted voltage generating circuit 175. Boosted voltage generating circuit 175 generates and supplies a boosted voltage Vpp to a Vpp supplying line 177. Vpp supplying line 177 applies the boosted voltage Vpp to row decoder 25 and the train of sense amplifiers 31.

The boosted voltage Vpp is applied to row decoder 25 to drive a word line at the high level. Furthermore, the boosted voltage Vpp is applied to the train of sense amplifiers 31 to drive a bit line at the high level. BIAC detector circuit 173 detects the mode for driving a plurality of word lines and supplies the Vpp supplying line with a word line driving voltage (referred to as "a first test voltage" hereinafter) which is the same in magnitude as the boosted voltage Vpp while limiting a current from a pad. Since the mode for driving a plurality of word lines is reliability testing of a gate oxide film of a memory cell transistor, /OE input pad 15 is not used. Thus, the first test voltage is provided from /OE input pad 15 in the mode for driving a plurality of word lines.

Figure 12:
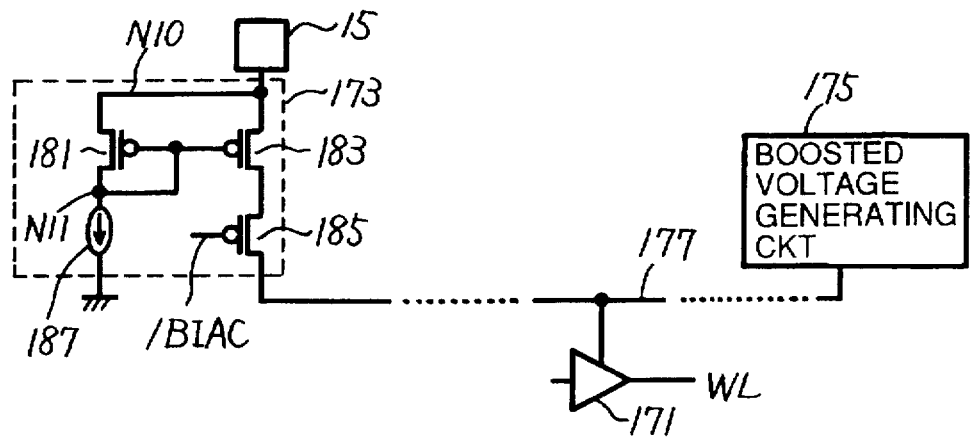
FIG. 12 is a circuit diagram showing in detail a portion of the DRAM according to the fifth embodiment of the present invention.

FIG. 12 schematically shows a portion of the DRAM according to the fifth embodiment. The portions which are similar to those shown in FIG. 11 are labeled with the identical reference characters and the description thereof is, where appropriate, not repeated. Referring to FIG. 12, the DRAM according to the fifth embodiment includes /OE input pad 15, BIAC detector circuit 173, boosted voltage generating circuit 175 and word driver 171. BIAC detector circuit 173 includes a constant-current source 187 and PMOS transistors 181, 183 and 185. Constant-current source 187 is provided between a node N11 and a node at the ground voltage. PMOS transistor 181 is provided between a node N10 and node N11. PMOS transistors 183 and 185 are connected in series between node N10 and Vpp supplying line 177. PMOS transistors 181 and 183 are connected to node N11 at their gates. PMOS transistor 185 receives the signal /BIAC at its gate. Word line 177 is connected to Vpp supplying line 177. Boosted voltage generating circuit 175 is connected to Vpp supplying line 177.

Since the signal /BIAC is at a low level in the mode for driving a plurality of word lines (in a burn-in test), PMOS transistor 185 is turned on. Furthermore, boosted voltage generating circuit 175 is inactivated in the mode for driving the plurality of word lines. Thus, /OE input pad 15 supplies the first test voltage to word driver 171. Then word driver 171 applies the first test voltage to a word line WL. Although, FIG. 12 shows one word driver 171 and one word line WL, actually there exist a plurality of word drivers and a plurality of word lines, and in the mode for driving a plurality of word line, the plurality of word drivers are applied with the first test voltage and the plurality of word lines are applied with the first test voltage. Since PMOS transistors 181 and 183 configure a current mirror circuit, a current flowing to PMOS transistor 185 is limited according to a current generated by constant-current source 187. That is, an excess current can be prevented from flowing into Vpp supplying line 177 from /OE input pad 15 in the mode for driving a plurality of word lines (in a burn-in test). Constant-current source 187 and the current mirror circuit (PMOS transistors 181 and 183) form a current limiting circuit.

In the normal mode, the signal /BIAC is at a high level and PMOS transistor 185 is turned off. Meanwhile, boosted voltage generating circuit 175 generates and applies the boosted voltage Vpp to word driver 171. Word driver 171 applies the boosted Vpp to a word line WL selected by a row address signal.

Figure 13:
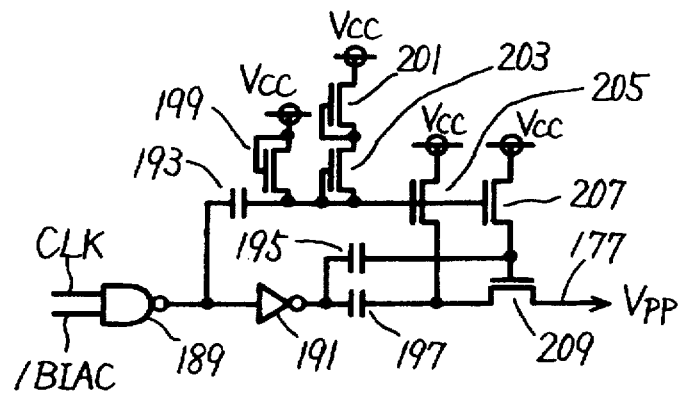
FIG. 13 is a circuit diagram showing in detail a boosted voltage generating circuit shown in FIG. 12.

FIG. 13 is a circuit diagram showing the detail of the boosted voltage generating circuit 175 shown in FIG. 12. The portions which are similar to those shown in FIG. 12 are labeled with the identical reference characters and the description thereof is, where appropriate, no repeated. Referring to FIG. 13, the boosted voltage generating circuit includes an NAND circuit 139, Ann innovator 191, capacitors 193, 195 and 197, and PMOS transistors 199, 201, 203, 205, 207 and 209. One input node of NAND circuit 189 receives a clock signal CLK and the other input node receives the signal /BIAC. One end of capacitor 193 is connected to an output node of NAND circuit 189. The other end of capacitor 193 is connected to the gates of NMOS transistors 203–207 and the sources of NMOS transistors 199 and 203. The gate and drain of NMOS transistor 199 is connected to a node at a power supply voltage Vcc. NMOS transistor 201 is connected to a node at the power supply voltage Vcc and to the drain of NMOS transistor 203. The gate of NMOS transistor 201 is connected to the train of NMOS transistor 203. An input node of inverter 191 is connected to the output node of NAND circuit 189. One end of capacitor 195 and one end of capacitor 197 are connected to an output node of inverter 191. The other end of capacitor 195 is connected to the source of NMOS transistor 207 and the gate of NMOS transistor 209. The other end of capacitor 197 is connected to one source/drain of NMOS transistor 209. NMOS transistor 205 is connected between a node at the power supply voltage Vcc and the other end of capacitor 197. The other source/drain of NMOS transistor 209 is connected to Vpp supplying line 177. NMOS transistor 207 is provided between a node at the power supply voltage Vcc and the gate of NMOS transistor 209.

Since the signal /BIAC is at a high level in the normal mode, the clock signal CLK is input to capacitor 193 and inverter 191. In response to the clock signal CLK, the boosted voltage Vpp is generated onto Vpp supplying line 177. In the mode for driving a plurality of word lines, the signal /BIAC is at a low level, the clock signal CLK is not input to capacitor 193 or inverter 191 and the boosted voltage generating circuit is inactivated.

The circuit for generating the signal /BIAC is similar in configuration to the burn-in mode detecting signal generating circuit shown in FIGS. 5 and 6. The burn-in detecting signal /STR generated by the burn-in mode detecting signal generating circuit of FIG. 5 corresponds to the signal /BIAC and the signal STR corresponds to the signal BIAC.

Since the DRAM according to the fifth embodiment is provided with a current limiting circuit (formed of constant-current source 187 and PMOS transistors 181 and 183) as described above, an excess current can be prevented from flowing into Vpp supplying line 177 from /OE input pad 15 in the mode for driving a plurality of word lines.

[Sixth Embodiment]

The entire configuration of a DRAM as a semiconductor integrated circuit device according to a sixth embodiment is similar to that of the DRAM according to the fifth embodiment (FIG. 11). That is, the DRAM according to the sixth embodiment is based on the DRAM according to the fifth embodiment.

Figure 14:
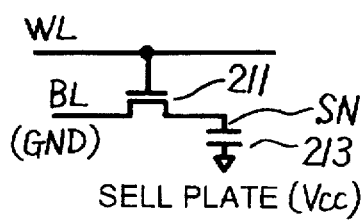
FIG. 14 is a circuit diagram showing in detail a memory cell of a DRAM according to a sixth embodiment of the present invention.

FIG. 14 is a circuit diagram showing in detail a memory cell of the DRAM according to the sixth embodiment. The portions which are similar to those shown in FIG. 12 are labeled with the identical reference characters and the description thereof is, where appropriate, not repeated. Referring to FIG. 14, the memory cell of the DRAM according to the sixth embodiment includes a memory cell transistor 211 and a memory cell capacitor 213. Memory cell transistor 211 is provided between a bit line BL and a storage node SN. The gate of memory cell transistor 211 is connected to a word line WL. One end of capacitor 213 is connected to storage node SN. In some memory cells, memory cell transistor 211 is connected between a bit line /BL and storage node SN. Bit line BL and bit line /BL form a pair of bit lines. In the DRAM according to the sixth embodiment, reliability testing of a gate oxide film of memory cell transistor 211 described in the fifth embodiment is conducted simultaneously with reliability testing of memory cell capacitor 213. That is, when word line WL is being activated to conduct reliability testing of the gate oxide film of memory cell transistor 211, the potential of bit line BL is set to a low level (GND level) and the other end (a cell plate) of memory cell capacitor 213 is set to a high level (Vcc level). This allows a sufficient potential is supplied to memory cell capacitor 213 since word line WL is activated, and thus reliability testing of memory cell capacitor 213 can be carried out simultaneously with that of the gate oxide film of memory cell transistor 211.

Figure 15:
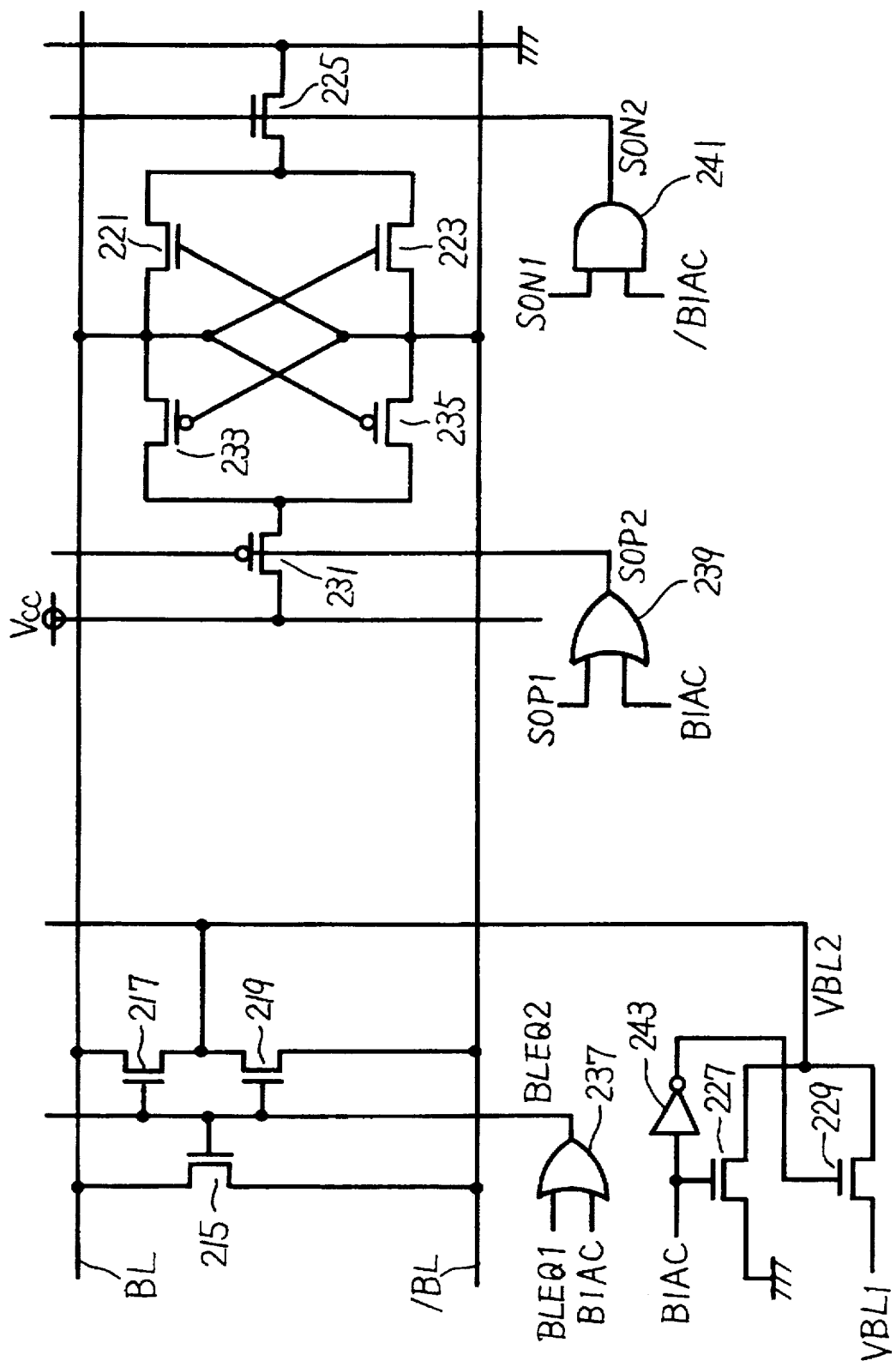
FIG. 15 is a circuit diagram showing in detail a portion of the DRAM according to the sixth embodiment of the present invention.
Figure 16:
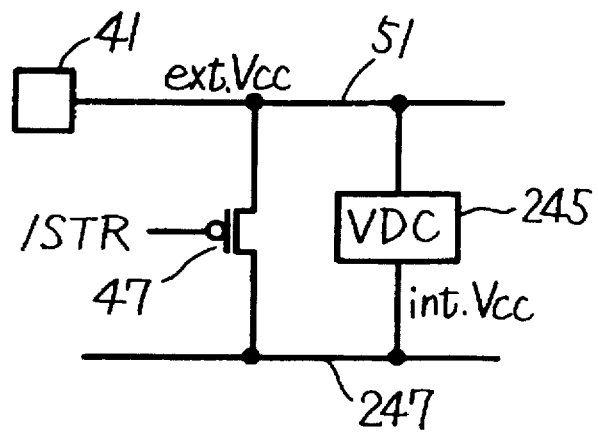
FIG. 16 schematically shows a portion of a conventional DRAM.
Figure 17:
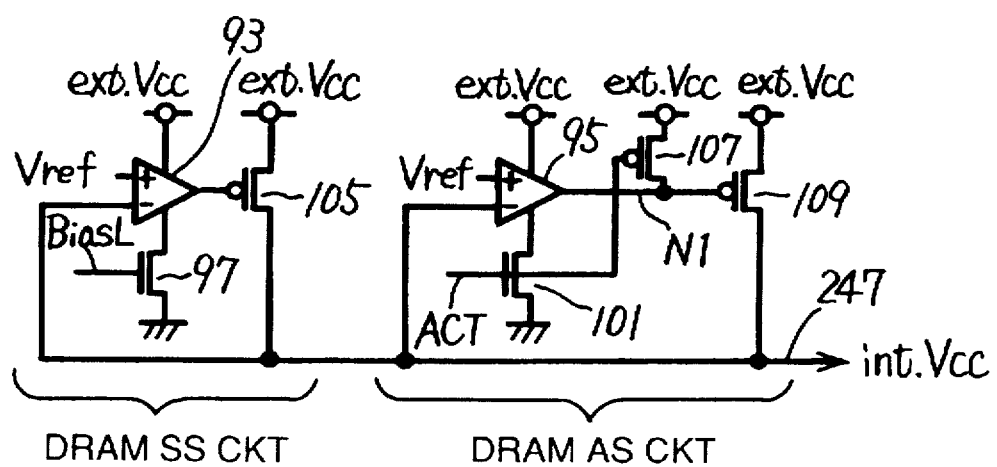
FIG. 17 is a circuit diagram showing in detail a portion of a voltage-down converter (VDC) shown in FIG. 16.

The operation of DRAM when bit line BL (/BL) is set to a low level (GND level) for reliability testing of memory cell capacitor 213 will now be described in detail. FIG. 15 is a circuit diagram showing in detail a portion of the DRAM according to the sixth embodiment. The DRAM according to the sixth embodiment includes: a sense amplifier formed of PMOS transistors 231, 233 and 235 and NMOS transistors 221, 223 and 225; a sense amplifier control circuit formed of an OR circuit 239 and an AND circuit 241; and an equalizer/precharger circuit formed of NMOS transistors 215, 217 and 219, an OR circuit 237, an inverter 243 and NMOS transistors 227 and 229. The DRAM also includes a pair of bit lines BL and /BL. Referring to FIG. 15, an output node of OR circuit 239 is connected to the gate of PMOS transistor 231. One input node of OR circuit 239 receives a signal S0B1 and the other input note receives a signal BIAC. An output node of AND circuit 241 is connected to the gate of NMOS transistor r225. One input node of AND circuit 241 receives a signal S0N1 and the other input node receives a signal /BIAC. An output node of OR circuit 237 is connected to the gates of NMOS transistors 215–219. One input node of OR circuit 237 receives a signal BLEQ1 and the other input node receives a signal BIAC. NMOS transistor 227 is provided between a node of the ground voltage and a precharge voltage supplying line VBL2. The gate of NMOS transistor 227 receives a signal BIAC. NMOS transistor 229 is provided between a precharge voltage supplying line VBL1 and precharge voltage supplying line VBL2. The gate of NMOS transistor 229 receives a signal which is inverted from the signal BIAC by inverter 245.

In the normal mode, the signal BIAC is set to a low level and the signal /BIAC is set to a high level. Accordingly, when a sense amplifier activating signal S0N1 of high level is input to AND circuit 241, the signal S0N2 is also set to a high level. Meanwhile, when OR circuit 239 receives a sense amplifier activating signal S0P1 of low level, the signal S0P2 is also set to a low level. Thus, NMOS transistor 225 and PMOS transistor 231 are turned on and the sense amplifier is activated.

In the normal mode, since the signal BLEQ1 is set to a high level when the sense amplifier is inactivated, the signal BLEQ2 is also set to a high level. Accordingly, NMOS transistors 215–219 are all turned on. Meanwhile, since the signal BIAC is at a low level in the normal mode, NMOS transistor 227 turns off and an NMOS transistor 229 turns on. Thus, the pair of bit lines BL and /BL receives half the power supply voltage Vcc (½ Vcc). That is, the pair of bit lines BL and /BL is precharged. When the sense amplifier is activated (i.e., when sensing), the signal BLEQ1 is set to a low level so that the signal BLEQ2 is set to a low level. Accordingly, NMOS transistors 215–219 are all turned off and bit lines BL and /BL are disconnected from each other. After the disconnection of bit line BL from bit line /BL, sensing is started.

When entering the test mode (the mode for driving a plurality of word lines), that is, when reliability testing of a gate oxide film of a memory cell transistor and reliability testing of a memory cell capacitor are carried out, the signal BIAC is set to a high level and the signal /BIAC is set to a low level. Accordingly, the signal S0N2 is set to a low level. Furthermore, the signal S0P2 is set to a high level. When entering the test mode, the sense amplifier is thus inactivated. Meanwhile, since the signal BLEQ2 is set to a high level, NMOS transistors 215 to 219 are all turned on. Since the signal BIAC is at a high level, NMOS transistor 227 turns on and NMOS transistor 229 turns off. This supplies the precharge voltage supplying line VBL2 with the ground voltage. That is, bit lines BL and /BL receive the ground voltage. Although the foregoing description has been provided with respect to one pair of bit lines, the plurality of pairs of bit lines BLs and /BLs of memory cell array 33 (FIG. 11) also receives the precharge voltage in the normal mode and the ground voltage in the test mode, as described above.

As described above, the DRAM according to the sixth embodiment is based on the DRAM according to the fifth embodiment, and the pair of bit lines BL and /BL receives the ground voltage and the cell plate receives the power supply voltage Vcc when reliability testing of a gate oxide film of the memory cell transistor is conducted. This allows reliability testing of the memory cell capacitor to be carried out simultaneously with reliability testing of the gate oxide film of the memory cell transistor in the DRAM according to the sixth embodiment. Furthermore, since the DRAM according to the sixth embodiment is based on the DRAM according to the fifth embodiment, it achieve an effect which is similar to that of the DRAM according to the fifth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device having a test mode for reliability evaluation and a normal mode, said semiconductor integrated circuit device comprising:

first internal power supply voltage generating means for generating a first internal power supply voltage to be supplied on a first internal power supply voltage supplying line according to an external power supply voltage supplied from an external power supply voltage supplying line;

second internal power supply voltage generating means for generating a second internal power supply voltage to be supplied on a second internal power supply voltage supplying line according to said external power supply voltage;

first connecting means provided between said external power supply voltage supplying line and said first internal power supply voltage supplying line; and second connecting means provided between said external power supply voltage supplying line and said second internal power supply voltage supplying line; wherein said first and second internal power supply voltage generating means are inactivated in said test mode and are activated in said normal mode, said first connecting means connects said external power supply voltage supplying line to said first internal power supply voltage supplying line in said test mode and disconnects said external power supply voltage supplying line from said first internal power supply voltage supplying line in said normal mode, and said second connecting means connects said external power supply voltage supplying line to said second internal power supply voltage supplying line in said test mode and disconnects said external power supply voltage supplying line from said second internal power supply voltage supplying line in said normal mode.

2. A semiconductor integrated circuit device having a test mode for reliability evaluation and a normal mode, said semiconductor integrated circuit device comprising:

first internal power supply voltage generating means for generating a first internal power supply voltage to be supplied on a first internal power supply voltage supplying line according to a first external power supply voltage supplied from a first external power supply voltage supplying line;

second internal power supply voltage generating means for generating a second internal power supply voltage to be supplied on a second internal power supply voltage supplying line according to said first external power supply voltage supplied from a second external power supply voltage supplying line;

first connecting means provided between said first external power supply voltage supplying line and said first internal power supply voltage supplying line; and second connecting means provided between said second external power supply voltage supplying line and said second internal power supply voltage supplying line; wherein said first and second internal power supply voltage generating means are inactivated in said test mode and are activated in said normal mode;

said first connecting means connects said first external power supply voltage supplying line to said first internal power supply voltage supplying line in said test mode and disconnects said first external power supply voltage supplying line from said first internal power supply voltage supplying line in said normal mode;

said second connecting means connects said second external power supply voltage supplying line to said second internal power supply voltage supplying line in said test mode, and disconnects said second external power supply voltage supplying line form said second internal power supply voltage supplying line in said normal mode;

in said test mode, said first external power supply voltage supplying line receives a second external power supply voltage and said second external power supply voltage supplying line receives a third external power supply voltage having a level different from that of said second external power supply voltage; and in said normal mode, said first and second external power supply voltage supplying lines receive said first external power supply voltage.

3. The semiconductor integrated circuit device according to claim 2, wherein said second and third external power supply voltages are applied in said test mode to render a difference between said second external power supply voltage and said first internal power supply voltage equal to that between said third external power supply voltage and said second internal power supply voltage.

4. The semiconductor integrate circuit device according to claim 2, further comprising third connecting means provided between said first external power supply voltage supplying line and said second external power supply voltage supplying line, wherein said third connecting means disconnects said first external power supply voltage supplying line from said second external power supply voltage supplying line in said test mode and connects said first external power supply voltage supplying line to said second external power supply voltage supplying line in said normal mode.

5. The semiconductor integrated circuit device according to claim 4, wherein said third connecting means is a transistor.

6. A semiconductor integrated circuit device having a test mode for reliability evaluation and a normal mode, said semiconductor integrated circuit device comprising:

first internal power supply voltage generating means for generating a first internal power supply voltage to be supplied on a first internal power supply voltage supplying line according to an external power supply voltage supplied from an external power supply voltage supplying line;

second internal power supply voltage generating means for generating a second internal power supply voltage to be supplied on a second internal power supply voltage supplying line according to said external power supply voltage;

first connecting means provided between said external power supply voltage supplying line and said first internal power supply voltage supplying line;

second connecting means provided between said external power supply voltage supplying line and an intermediate node; and down-converting means provided between said intermediate node and said second internal power supply voltage supplying line; wherein said first and second internal power supply voltage generating means are inactivated in said test mode and are activated in said normal mode;

said first connecting means connects said external power supply voltage supplying line to said first internal power supply voltage supplying line in said test mode and disconnects said external power supply voltage supplying line from said first internal power supply voltage supplying line in said normal mode;

said second connecting means connects said external power supply voltage supplying line to said intermediate mode in said test mode and disconnects said external power supply voltage supplying line from said intermediate node in said normal mode; and said down-converting means supplies a voltage down-converted from said external power supply voltage to said second internal power supply voltage supplying line in said test mode.

7. The semiconductor integrated circuit device according to claim 6, wherein when a level of said first internal power supply voltage is higher than that of said second internal power supply voltage, said down-converting means down-converts said external power supply voltage to render a difference between the voltage down-converted from said external power supply voltage and said second internal power supply voltage equal to a difference between said external power supply voltage and said first internal power supply voltage.

8. The semiconductor integrated circuit device according to claim 7, wherein said down-converting means is a transistor connected to form a diode.

9. The semiconductor integrated circuit device according to claim 1, wherein said first and second connecting means are transistors.

10. The semiconductor integrated circuit device according to claim 2, wherein said first and second connecting means are transistors.

11. The semiconductor integrated circuit device according to claim 6, wherein said first and second connecting means are transistors.

12. A semiconductor integrated circuit device having a test mode for reliability evaluation and a normal mode, said semiconductor integrated circuit device comprising:

a plurality of memory cells arranged in a matrix of rows and columns;

a plurality of word lines each arranged corresponding to each of the rows and each having corresponding said memory cells connected thereto;

a plurality of driver means each provided corresponding to each of the word lines;

test voltage supplying means for supplying a first test voltage according to an external power supply voltage to each of said driver means via a voltage supplying line in said test mode; and boosted voltage generating means for generating a boosted voltage and supplying said boosted voltage to said driver means in said normal mode; wherein in said normal mode, said driver means corresponding to a selected said word line applies a voltage to the corresponding said word line according to said boosted voltage, and in said test mode, each said driver means applies a voltage to a corresponding said word line according to said first test voltage, and wherein said test voltage supplying means includes current limiting means for limiting a current flowing into said voltage supplying line.

13. The semiconductor integrated circuit device according to claim 12, wherein said current limiting means includes a constant-current source for generating a constant-current and current mirror means.

14. The semiconductor integrated circuit device according to claim 12, further comprising a plurality of pairs of bit lines each arranged corresponding to each of the rows and each having said memory cells of a corresponding row connected thereto, said each memory cell including:

a memory cell transistor; and a memory cell capacitor; wherein a control electrode of said memory cell transistor is connected a corresponding said word line, a first electrode of said memory cell transistor is connected to a corresponding bit line of a corresponding one of said pairs of bit lines, and a second electrode of said memory cell transistor is connected to one end of said memory cell capacitor; and in said test mode, the other end of said memory cell capacitor receives a second test voltage and each of said pairs of bit lines receives a ground voltage.

15. The semiconductor integrated circuit device according to claim 14, further comprising:

a plurality of sense amplifiers provided each corresponding to each of said pairs of bit lines for amplifying a potential difference between bit lines of a corresponding pair of bit lines;

equalizing/precharging means for setting each of said pairs of bit lines to a predetermined potential; and sense amplifier controlling means for stopping operation of each of said sense amplifiers in said test mode; wherein said equalizing/precharging means sets said each of said pairs of bit lines to a ground potential in said test mode.

* * * * *